United States Patent [19]

Yoshimi et al.

[11] 4,327,331
[45] Apr. 27, 1982

[54] AUDIO AMPLIFIER DEVICE

[75] Inventors: Toshikazu Yoshimi, Tokorozawa; Hiroshi Ono, Tokyo, both of Japan

[73] Assignee: Pioneer Electronic Corporation, Tokyo, Japan; a part interest

[21] Appl. No.: 91,995

[22] Filed: Nov. 7, 1979

[51] Int. Cl.³ .................. H03F 3/68; H03G 11/04
[52] U.S. Cl. .................................. 330/126; 333/17 L
[58] Field of Search ............. 330/126, 149; 333/17 L; 179/1 D, 1 P

[56] References Cited

U.S. PATENT DOCUMENTS 3,665,345  5/1972  Dolby ................................ 330/149
4,045,748  8/1977  Filliman ........................... 330/126

Primary Examiner—James B. Mullins
Assistant Examiner—Gene Wan
Attorney, Agent, or Firm—Sughrue, Mion, Zinn, Macpeak and Seas

[57] ABSTRACT

An audio amplifier device is disclosed by which an audio signal is separated in frequency into three or more signal components and the high frequency component or components and/or the low frequency component or components are attenuated automatically while a middle frequency component is amplified without attenuation.

6 Claims, 4 Drawing Figures

AUDIO AMPLIFIER DEVICE

BACKGROUND OF THE INVENTION

The present invention relates to an audio amplifier circuit device which functions to automatically restrict other frequency signals than desired signals without manual selecting device and, more particularly, to an audio amplifier circuit device which amplifiers frequency signals corresponding to usual sounds without attenuation and, when noise components which may be high and/or low frequency exist, amplifies only desired components by automatically attenuating the high and-/or low frequency components.

It should be understood that the term "audio amplifier circuit device" used herein means a device adapted to be connected between two acoustic transducers, e.g. a microphone and a loud speaker. An example of applications of this invention may be an acousticon.

In order to restrict undesired sound, it has been used to add a switch means to the amplifier circuit device, which, when it is used in an area where noises exist, is actuated to reduce the amplifier gain or to limit output power for the undesired sounds.

That is, the user of the sound collecting and reproducing device has to operate the selector switch means according to his own judgement of whether or not he is in a noisy environment and which frequency components are to be restricted. In a case where the sound collecting and reproducing device is the acousticon, the manual operation of the selector switch means becomes frequent and difficult because of the movement of the user himself which causes the noise to be not steady.

SUMMARY OF THE INVENTION

A primary object of the present invention is to provide an audio amplifier circuit device which, in a calm situation, can operate without limitation of sound frequency range and, in a noisy situation, can operate with an automatic exclusion of frequencies outside of the desired frequency range.

Another object of the present invention is to provide an audio amplifier circuit device by which, in the noisy situation, a low frequency range which is usually main component of the noise is automatically attenuated to provide a good S/N ratio.

A further object of the present invention is to provide an audio amplifier circuit device by which, in the noisy situation, components in not only the low frequency but also a high frequency range are automatically attenuated.

A still further object of the present invention is to provide an audio amplifier circuit device by which, in a noisy place such as airport etc. in which there are high frequency noises, the high frequency components are automatically attenuated.

DETAILED DESCRIPTION OF THE PREFERRED EMBODIMENT

Figure 1:
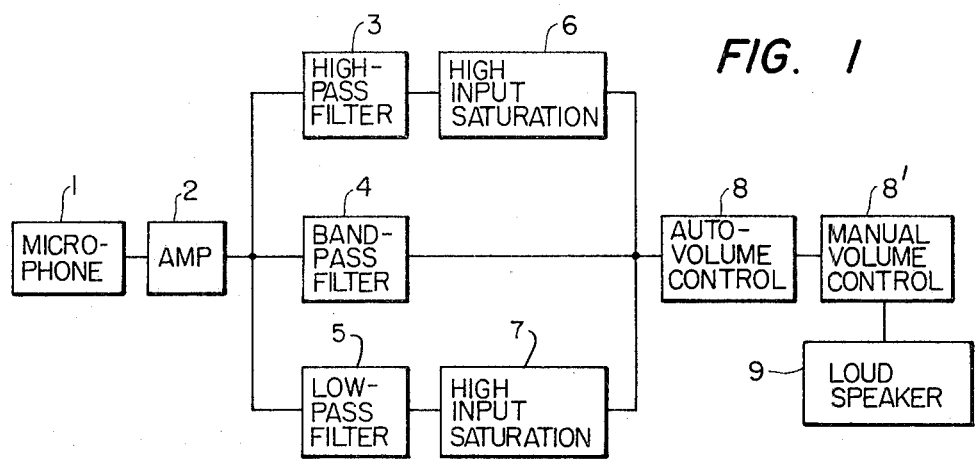
FIG. 1 is an embodiment of the present invention.

FIG. 1 is a block diagram showing an embodiment of the present invention. In FIG. 1, an output of a microphone 1 is connected to an input of an amplifier 2 whose output is connected to inputs of a high pass filter 3, a band pass filter 4 and a low pass filter 5. An output of the high pass filter 3 is connected to an input of a first saturation circuit 6 which functions to provide an output voltage proportional to a voltage of an input sound signal when the latter is low and to provide a saturated output voltage when the input voltage is above a threshold level. The output of the low-pass filter 5 is connected to an input of a second saturation circuit 7 whose function is similar to that of the first saturation circuit 6. That is, each of the circuits 6 and 7 may be an automatic gain control (AGC) circuit and/or a limiter.

The outputs of the high pass filter 3, the band pass filter 4 and the low pass filter 5 are connected to an automatic signal amplitude regulator 8 which functions to automatically control the amplitude of a composite signal of the outputs signals from the filters. The automatic amplitude regulator 8 may likewise be an AGC and/or a limiter.

The output of the amplitude regulator 8 is supplied through a manual amplitude regulator 8', if necessary, to an electroacoustic transducer 9 such as loud speaker or earphone.

In the audio amplifier circuit devices 6, 7 and 8 shown in FIG. 1, a circuit which converts a portion of the output voltage of the circuit device into a d.c. voltage and restricts the output voltage of the circuit device by controlling the amplification thereof with the d.c. voltage level, a circuit which restricts the output of the circuit device by changing a saturation level thereof with a regulation of a reference voltage or current, a circuit which restricts the output of the circuit device by changing a limiting level, using diodes or a circuit which, together with the first one of the above circuits, reduces the distortion factor of the output signal using the divided frequency bands may be used as the first circuit 6, the second circuit 7 and/or the amplitude regulator 8.

Further, it may be possible to use a circuit whose output voltage is automatically changed depending upon frequency bands (e.g. 50–80 Hz band and 7,000–10,000 Hz band) which are not included in the usual voice frequency, or a circuit which automatically changes an output voltage of the low pass filter and/or high pass filter by changing the tilting of the filter itself or automatically switching between filters having different tiltings, as the circuit 6, 7 and/or 8. Furthermore, in order to smooth the restriction of undesired frequency signals, it may be possible to give a hysterisis characteristic to the circuit 6 and/or 7.

Figure 2:
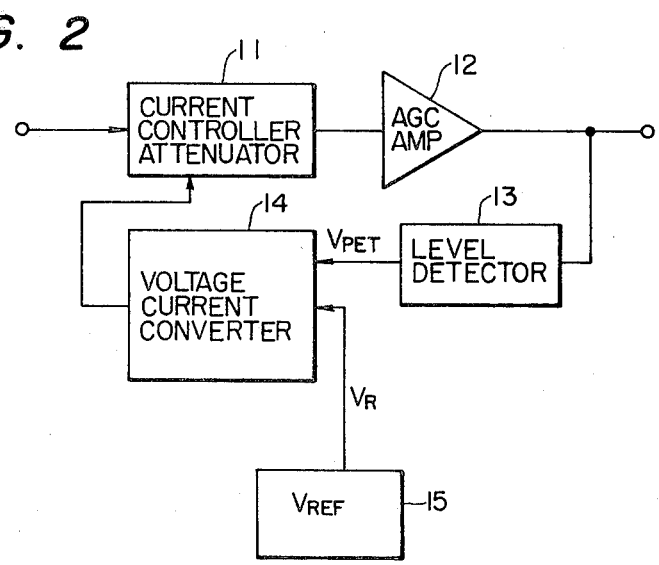
FIG. 2 is an example of circuits for a circuit component in FIG. 1.

FIG. 2 shows a block diagram of an AGC which is an example of the second one of the above circuits which may be used as the circuits 6, 7 and/or 8 in FIG. 1. The AGC comprises a current controlled attenuator 11, an AGC amplifer 12 connected to the attenuator 11, a level detector 13, a voltage current converter 14 and a reference voltage circuit 15. An output of the level detector 13 is connected to one of two inputs of the voltage current converter 14, the other input of the latter being supplied with a reference voltage $V_R$ from the reference voltage circuit 15. Since the operation of the AGC in FIG. 2 is well known, detailed explanation thereof may not be necessary. It is sufficient to say that the saturation level of the attenuator 11 is determined by the output level of the AGC amplifier 12 in comparison with the output voltage level of the reference voltage circuit 15.

Figure 3:
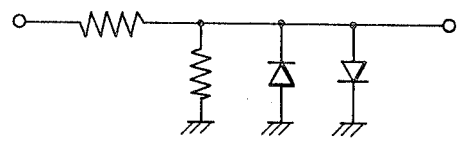
FIG. 3 is another example of circuits for circuit component in FIG. 1.

FIG. 3 shows an example of a limiter which may be used as the circuits 6 and/or the circuit 7 and in which the output voltage is limited by changing the limiting level with utilizing the diode characteristic. When the limiter is used for the circuits 6 and 7 respectively, the amplitude regulator 8 may take in the form of the AGC shown in FIG. 3.

The frequencies set to the respective filters are, 300 Hz–5,000 Hz for the band pass filter, 4,000 Hz for the high pass filter, and 500 Hz for the low pass filter, for example. These values may be changed according to the specific conditions of the user.

In operation, an input acoustic signal received by the microphone 1 or telephone pickup coil 10 is converted into an electric signal and the latter is fed to the high pass filter 3, the band pass filter 4 and the low pass filter 5. Outputs of the filters 3, 4 and 5 are combined again and fed to the automatic amplitude regulator 8 in which the amplitude of the combined output is automatically regulated. The output of the regulator 8 is passed through the manual amplitude regulator 8', if necessary, and then converted into sound by the loud speaker or earphone 9.

When the voltage level of the input signal is low, the circuits 6 and 7 do not affect the signal substantially, resulting in a flat amplification characteristic; and when the signal level is high, the saturation characteristics of the circuits 6 and 7 become effective to limit the signal level to a certain value. Therefore, relatively high frequency portions and/or relatively low frequency portions of the signal which are main components of the noise are attenuated while the middle frequency components are amplified normally.

Accordingly, there is no need of providing a manual switching means for selectively amplifying a signal in a desired frequency band.

Figure 4:
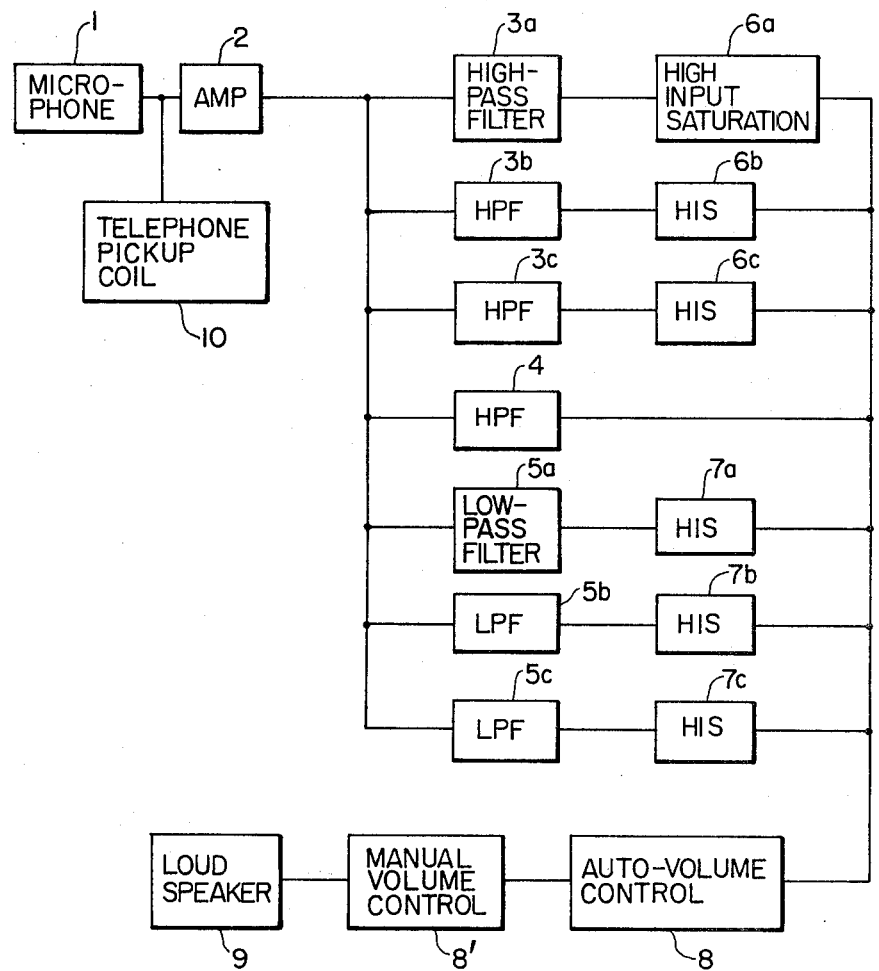
FIG. 4 is another embodiment of the present invention.

FIG. 4 shows another embodiment of the present invention in which similar components to those in FIG. 1 are shown by the same reference numerals.

In FIG. 4, the frequency band of the high pass filter 3 is further sub-divided and the sub-divided bands are treated by filters 3a to 3c, and circuits 6a to 6c connected in series with the high pass filters, respectively, in the same manner as mentioned in connection to FIG. 1.

The frequency band of the low pass filter 5 is also sub-divided and the sub-divided bands are treated by filters 5a to 5c and circuits 7a to 7c connected in series with the low pass filters.

What is claimed is:

1. An audio amplifier device comprising:

a first transducer means (1) for transducing an acoustic signal into an electric signal;

a first channel means (5, 7) having an input connected to an output of said first transducer means, said first channel means being adapted to pass and amplify a low frequency component of the electric signal while providing an output signal proportional to an input signal when the level thereof is low, and providing a saturated output signal when said input signal is above a predetermined level;

a second channel means having an input connected to said output of said first transducer means, said second channel means being adapted to pass the remaining component of the electric signal and comprising a band pass filter (4) adapted to pass a middle frequency component of said remaining component, and at least one set of a high pass filter (3) and an amplitude limiting means (6), said set being connected in parallel with said band pass filter, said high pass filter being adapted to pass a component of said remaining component which is higher in frequency than said middle frequency component;

a signal combining and restricting means (8) having an input connected to outputs of said first and second channel means for combining and amplifying output signals of said first and second channel means with a variable gain; and a second transducer means (9) connected to an output of said signal combining and restricting means for transducing an output signal thereof into an acoustic signal.

2. An audio amplifier device as defined in claim 1, wherein said first channel means includes at least one set of a low pass filter and an amplitude limiting means connected in series with said low pass filter.

3. An audio amplifier device as defined in claim 1, wherein the frequency band of said band pass filter is within the ranges of 300 Hz to 5000 Hz, and the cut-off frequencies of said low pass filter and said high pass filter are 500 Hz and 4000 Hz, respectively.

4. An audio amplifier device as defined in claims 2 or 3, wherein said amplitude limiting means of said first channel means comprises a circuit for limiting an amplification factor thereof according to an output level thereof.

5. An audio amplifier device as defined in claims 2 or 3, wherein said amplitude limiting means of said first channel means comprises a circuit whose output level for a frequency component which is outside of the usual voice frequency is automatically restricted.

6. An audio amplifier device as defined in claims 1 or 3, wherein said amplitude limiting means of said second channel means comprises a circuit for limiting an amplification factor thereof according to an output level thereof.

* * * * *